United States Patent
Ohkura et al.

(10) Patent No.: US 6,272,732 B1
(45) Date of Patent: Aug. 14, 2001

(54) OXIDE SUPERCONDUCTING WIRE, MANUFACTURING METHOD THEREOF, OXIDE SUPERCONDUCTING COIL AND CABLE CONDUCTOR

(75) Inventors: Kengo Ohkura; Kenichi Sato, both of Osaka (JP)

(73) Assignee: Sumitomo Electric Industries, Ltd. (JP)

(*) Notice: Subject to any disclaimer, the term of this patent is extended or adjusted under 35 U.S.C. 154(b) by 0 days.

(21) Appl. No.: 09/640,527

(22) Filed: Aug. 17, 2000

Related U.S. Application Data

(62) Division of application No. 08/739,908, filed on Oct. 30, 1996, which is a division of application No. 08/282,347, filed on Jul. 29, 1994, now abandoned.

(30) Foreign Application Priority Data

Aug. 2, 1993 (JP) .................................... 5-191374
Aug. 10, 1993 (JP) .................................... 5-198626
Dec. 28, 1993 (JP) .................................... 5-336852

(51) Int. Cl.[7] .................................................. H01L 39/24
(52) U.S. Cl. ............................ 29/599; 505/431; 505/433
(58) Field of Search ............................... 29/599; 505/100, 505/431, 433, 704, 740

(56) References Cited

U.S. PATENT DOCUMENTS 4,885,273 * 12/1989 Sugimoto et al. ............... 29/599 X
4,952,554 * 8/1990 Jin et al. ............................ 29/599 X
4,954,479 * 9/1990 Dubois et al. .................... 29/599 X
4,988,669 * 1/1991 Dersch .................................. 505/704
5,004,722 * 4/1991 Tallman ............................. 29/599 X
5,043,320 * 8/1991 Meyer et al. ...................... 29/599 X
5,045,527 * 9/1991 Ikeno et al. .......................... 505/740
5,063,200 * 11/1991 Okada et al. ....................... 505/704
5,081,075 * 1/1992 Jin et al. ............................. 29/599 X
5,132,278 * 7/1992 Sdtevens et al. .................... 505/704
5,169,831 * 12/1992 Yamamoto et al. .
5,424,282 * 6/1995 Yamamoto et al. ..................... 29/599
5,932,523 * 8/1999 Fujikami et al. .

FOREIGN PATENT DOCUMENTS

-503525-A1 * 3/1992 (EP) .
WO-89/02656 * 3/1989 (WO) .

* cited by examiner

Primary Examiner—Carl J. Arbes
(74) Attorney, Agent, or Firm—Pennie & Edmonds LLP

(57) ABSTRACT

A long oxide superconducting wire for a coil or a cable, manufacturing method thereof, an oxide superconducting coil and a cable conductor which have high operational frequency are provided. The wire is a tape-like oxide superconducting wire including a plurality of filaments of oxide superconductor embedded in a matrix, and each filament is twisted spirally along the longitudinal direction of the tape wire. By winding the wire in a coil, an oxide superconducting coil is obtained. When a plurality of such wires are collected, an oxide superconducting cable conductor can be obtained.

3 Claims, 6 Drawing Sheets

OXIDE SUPERCONDUCTING WIRE, MANUFACTURING METHOD THEREOF, OXIDE SUPERCONDUCTING COIL AND CABLE CONDUCTOR

This is a division of application Ser. No. 08/739,908 filed Oct. 30, 1996, which is a division of application Ser. No. 08/282,347 filed Jul. 29, 1994, now abandoned.

BACKGROUND OF THE INVENTION

1. Field of the Invention

The present invention relates to a superconducting wire and manufacturing method thereof, as well as to an oxide superconducting coil and a cable conductor. More specifically, the present invention relates to an oxide superconducting wire, manufacturing method thereof, an oxide superconducting coil and a cable conductor having high critical current density and low a.c. loss.

2. Description of the Background Art

In recent years, superconducting materials of ceramics, i.e., oxide superconducting materials, are watched with interest due to higher critical temperatures thereof. Among these materials, yttrium, bismuth and thallium oxide superconducting materials which exhibit high critical temperatures of about 90K, 110K and 120K respectively, are expected for practical application.

A single-filamentary oxide superconducting wire having high critical current density formed of such oxide superconducting materials is obtained by heat treating and then covering with a metal sheath the material powder, drawing, rolling and by further heat treatment. Similarly, an oxide superconducting multi-filamentary wire having high critical current density is obtained by heat treating powder mainly consisting of oxide superconducting material, then covering the same with a metal sheath, drawing and putting together the as-obtained wires to provide a multi-filamentary wire, and further by drawing, rolling and heat treating the same.

It has been conventionally known that an oxide superconducting wire having higher critical current density can be obtained by repeating several times the steps of rolling and heat treatment in manufacturing such an oxide superconducting wire.

If such an oxide superconducting wire is to be applied to an a.c. cable or magnet, it must have low a.c. loss, high strength and superior property under bending-strain, in addition to the high critical current.

The single-filamentary and the multi-filamentary oxide superconducting wires manufactured through the conventional method described above have as high a critical density as 30000 A/cm$^2$ or higher.

However when an a.c. current is applied with the wire wound in a coil, there is generated an a.c. loss heat radiation. This is because an induced current flows between the metal sheath and the ceramics when an a.c. current is applied, resulting in heat radiation caused by a.c. loss of normal conduction resistance of the metal sheath, as compared to the case when a d.c. current is applied, in which case current flows only through the ceramic portions. Since the temperature of the coil as a whole increases, critical current density is decreased.

Accordingly, the operational frequency of the coil manufactured in accordance with the conventional method has been about 0.1 Hz at the highest.

SUMMARY OF THE INVENTION

An object of the present invention is to solve the above described problems and to provide a long oxide superconducting wire for a coil or a cable, manufacturing method thereof, an oxide superconducting coil and a cable conductor which have high operational frequency.

Another object of the present invention is to provide a long oxide superconducting wire for a coil or a cable, manufacturing method thereof, an oxide superconducting coil and a cable conductor having high operational frequency and high strength.

A further object of the present invention is to provide a long oxide superconducting wire for a coil or a cable, manufacturing method thereof, an oxide superconducting coil and a cable conductor having high operational frequency and superior property under bending-strain.

According to one aspect of the present invention, an oxide superconducting wire is provided, which wire is a tape-like oxide superconducting wire including a plurality of filaments of oxide superconductor embedded in a matrix, with the filament twisted spirally along the longitudinal direction of the tape wire.

As mentioned above, the filament of oxide superconductor embedded in the matrix is twisted spirally along the longitudinal direction of the wire. Therefore, the induced current flowing between the matrix and the filament is cut at every twist pitch and flows in a small loop, so that the magnitude of the current is limited. As a result, heat radiation caused by a.c. loss of the matrix can be avoided. This function will be discussed in detail with reference to the figures.

FIG. 8 is a perspective view showing a conventional oxide superconducting multi-filamentary wire.

Referring to FIG. 8, the multi-filamentary wire is constituted by filaments 11a, 11b, 11c and 11d of oxide superconductor embedded in a silver matrix 2.

When the multi-filamentary wire structured in this manner experiences a change in the magnetic field dB/dt generated, for example, by a coil, there is generated a large induced current loop 13 other than the applied current between filaments 11a and 11b because of an induced electromotive force, and therefore a large loop current I flows. Accordingly, heat radiation derived from the superconducting resistance of silver matrix 2 increases in proportion to (dB/dt)$^2$ with the frequency.

By contrast, FIG. 7 is a perspective view showing an oxide superconducting multi-filamentary wire of one example of the present invention.

Referring to FIG. 7, the multi-core wire is constituted by filaments 1a, 1b, 1c and 1d of oxide superconductor embedded in silver matrix 2, with each of the filaments 1a, 1b, 1c and 1d twisted spirally along the longitudinal direction of the multi-filamentary wire.

When the multi-filamentary wire structured in this manner experiences the change in the magnetic field dB/dt, the induced current loop 3 is limited by the length $L_P$ of the twist pitch of the filaments 1a and 1b. Consequently, the magnitude of loop current $I_P$ also decreases, and the a.c. loss decreases as the length $L_P$ of the twist pitch decreases.

Preferably, the pitch of the twist should be at least the width of the wire. This prevents disconnection of the wire during twisting, rolling and drawing.

Preferably, the matrix may be silver or silver alloy, since the matrix of silver or silver alloy can serve as a stabilizer. The a.c. loss mentioned above is in reverse proportion to the resistance value of the matrix. In order to reduce the a.c. loss, it is preferable to provide a matrix having high resistance, by using silver alloy.

According to another aspect of the present invention, an oxide superconducting wire is provided which is similar to the wire of the aforementioned aspect and additionally characterized in that each of the plurality of filaments is covered by silver or silver alloy, and a barrier layer of metal or metal alloy having the resistance value at a room temperature higher than that of silver alloy and in the range of $10^{-6}$ to $10^{-10}$ $\Omega$m is provided to surround one or more filaments covered by silver or silver alloy in the longitudinal direction of the wire.

More preferably, the barrier layer should be formed of metal or metal alloy having the resistance value at a room temperature in the range of from $10^{-7}$ to $10^{-9}$ $\Omega$m.

As described above, a barrier layer of high resistance is provided to surround the filament in the longitudinal direction of the wire is provided. The barrier layer may be provided thin over the surface or at the interface between the oxide superconducting material and the metal sheath before the single-filamentary wires are put together, and as it experiences work hardening during the subsequent steps of drawing, twisting and rolling, disconnection is not caused. In addition, since the barrier material experiences appropriate work hardening, tensile strength and bending strength of the finished tape are improved, and therefore an oxide superconducting wire, which has high strength and high resistance against high electromagnetic stress when it is wound into a coil and current is applied, can be obtained.

According to a still another aspect of the present invention, an oxide superconducting coil is provided which is formed of a tape-like oxide superconducting wire including a plurality of filaments of oxide superconductor embedded in a matrix, with each filament twisted spirally along the longitudinal direction of the tape wire. In the superconducting wire structured in this manner, heat radiation caused by the a.c. loss of the matrix is reduced as already described. Therefore, a coil having high operational frequency can be obtained.

In accordance with a still another aspect of the present invention, an oxide superconducting cable conductor is provided, which is formed of a tape-like oxide superconducting wire including a plurality of filaments of oxide superconductor embedded in a matrix, with each filament being twisted spirally along the longitudinal direction of the tape wire. In the superconductor wire structured in this manner, heat radiation caused by a.c. loss of the matrix is reduced as already described. Therefore, a cable conductor having high operational frequency can be obtained.

According to a still further aspect of the present invention, a method of manufacturing an oxide superconducting wire is provided which includes the steps of heat treating and then covering with a metal sheath, powder mainly consisting of oxide superconducting material, drawing and putting together the as-obtained wires to provide a multi-filamentary wire, drawing and rolling, and heat treating, in which in the step of drawing and rolling after the wires are put together to provide a multi-filamentary wire, each as-obtained wire with circular cross section is drawn, twisted and then rolled.

According to this method, by this twisting, the induced current flowing between the metal sheath and the ceramics is cut at every pitch of the twist and flows in a small loop, so that the magnitude of the current is limited and heat radiation caused by the a.c. loss of the metal sheath can be avoided. Therefore, operational frequency when the wire is applied to a coil or a cable in the conventional manner can be increased. The twisting is effected after the material powder is covered by the metal sheath, drawn, put together to provide a multi-filamentary wire and again drawn, before rolling. Therefore, there is not an irregularity of filaments inside after rolling, and therefore, rolling can be carried out easily.

A technique for reducing surface of a shielded current loop by twisting filaments in a metal supercoducting wire having circular cross section has been disclosed in Yamamura et al. *Chodendo Kogaku* (Superconductivity Engineering) 1974, pp. 64–66.

However, the present invention is directed to a very thin tape-like oxide superconducting wire. According to the present invention, it becomes possible to twist the filaments in the tape-like wire by twisting the wire while it has circular cross section and then rolling.

Preferably, after the wires are twisted, the wires should be again drawn and rolled.

Since the wires are drawn, then twisted and again drawn, swells of the wires generated during the twisting process can be eliminated. Therefore, after rolling, there is not snaking of the tape, and the tape can be uniformly rolled. There is not a possibility of untwisting of the filaments in the tape.

Preferably, the pitch of the twist after rolling should be made at least the width of the wire after rolling. If the twist pitch is made equal to or larger than the tape width after rolling, the wire is not disconnected during the steps of twisting, rolling and drawing.

More preferably, the angle of inclination at the step of twisting after rolling should be made at least 0.5° with respect to the direction of the wire. If the twisting is effected in this range, the filament simply has its arrangement directly changed in the longitudinal direction, and therefore uneven processing of the filament is prevented. Further, since the filament is arranged at an angle with respect to the longitudinal direction of the tape because of the twist, the bending-strain of the filament when the tape is bent can be reduced as a result. Therefore, property under stain of the tape with respect to the critical current can be improved when the tape is twisted. If the angle of twist is smaller than 0.5°, the effect of twisting is not obtained, and this effect can be obtained if the angle is 0.5° or larger.

The angle of inclination here refers to the maximum angle α of the filament 51 positioned at the outermost layer of the wire and the center line 50 along the longitudinal direction of the wire.

According to a still further aspect of the present invention, a method of manufacturing an oxide superconducting wire is provided which includes the steps of heat treating and then covering with a metal sheath, powder mainly consisting of an oxide superconducting material, drawing and putting together the as-obtained wires to provide a multi-filamentary wire, drawing and rolling, and heat treating, in which a metal or metal alloy having resistance value at a room temperature higher than that of the metal sheath and in the range of $10^{-6}$ to $10^{-10}$ $\Omega$m is provided at the surface of the as-obtained single filamentary wire or between the oxide superconducting material and the metal sheath, before the single filamentary wires are put together to provide the multi-filamentary wire.

More preferably, the metal or metal alloy deposited at the surface of the single-filamentary wire or at the interface between the oxide superconducting material and the metal sheath has a resistance value at a room temperature in the range of $10^{-7}$ to $10^{-9}$ $\Omega$m.

In this manner, a barrier layer of metal or metal alloy having high resistance is provided at the surface of the single-filamentary wire or at the interface between the oxide superconducting material and the metal sheath. The barrier of high resistance disposed between the filaments may be provided thin over the surface or at the interface between the oxide superconducting material and the metal sheath before the single-filamentary wires are put together. Since the barrier experiences work hardening during the subsequent steps of drawing, twisting and rolling, disconnection is not caused. Further, since the barrier material experiences appropriate work hardening, tensile strength and bending strength of the finished tape are improved, and therefore an oxide superconducting wire which has high strength and high resistance against high electromagnetic stress when it is wound into a coil and current is applied thereto, can be obtained.

Preferably, in the steps of drawing and rolling after the wires are put together to provide a multi-filamentary wire, the as-obtained wire having the circular cross section is drawn and twisted. By twisting the wire in this manner, the heat radiation caused by the a.c. loss of the metal sheath can be avoided, as already described.

As described above, according to the present invention, an oxide superconducting wire with low a.c. loss can be obtained. Therefore, the oxide superconducting wire manufactured in accordance with the present invention can be applied to an oxide superconducting magnet or cable operated at a high frequency including power frequency of 0.1 Hz or higher, and it can be also applied widely to various coils for a.c. motors such as induction motors, synchronous motors, as well as for transformers, and to large-capacity a.c. cable conductors.

Further, according to the present invention, an oxide superconducting wire which has not only the low a.c. loss but also high strength and superior property under stain can be obtained.

It is difficult to reduce the twist pitch in actual manufacturing. However, when silver alloy is used, similar characteristic effect as obtained when the twist pitch is reduced, can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The oxide superconducting wire, superconducting coil and manufacturing method thereof in accordance with the present invention will be described.

EXAMPLE 1

$Bi_2O_3$, PbO, $SrCO_3$, $CaCO_3$ and CuO were mixed to have the composition ratio of Bi:Pb:Sr:Ca:Cu= 1.81:0.40:1.98:2.21:3.03. The mixed powder was successively subjected to heat treatments in the ambient atmosphere at 750° C. for 12 hours, 800° C. for 8 hours, and in a reduced pressure atmosphere of 1 Torr, at 760° C. for 8 hours. After each step of heat treatment, the powder was pulverized. The power obtained through the heat treatment and pulverization was further pulverized by a ball mill, and powder of sub micron order was obtained. The powder was subjected to heat treatment at 800° C. for 2 hours, and filled in a metal pipe having the outer diameter of 12 mm and inner diameter of 9 mm.

Figure 1:
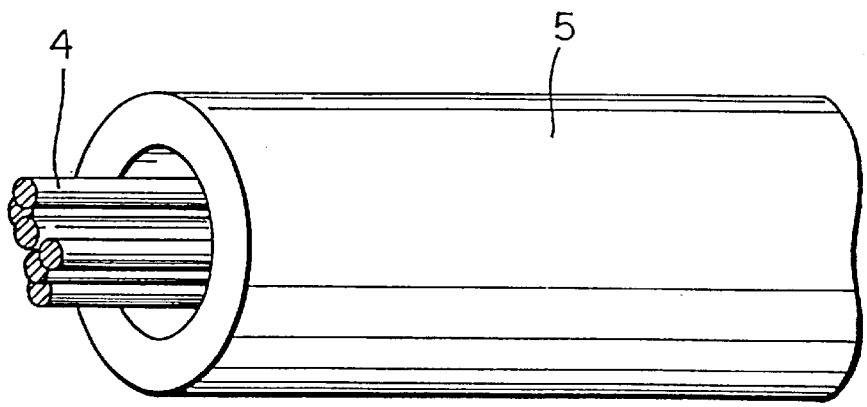
FIGS. 1 to 3 show steps of manufacturing an oxide superconducting wire in accordance with the present invention.
Figure 2:
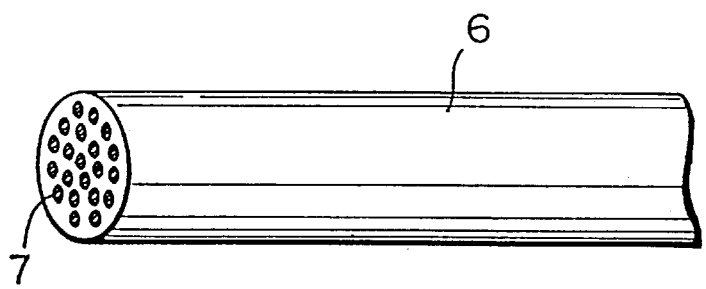

The powder filled in the silver pipe was drawn to 1 mm and thus a strand was fabricated. Thereafter, a plurality of stands 4 were put together and inserted in a metal pipe having the outer diameter of 12 mm and inner diameter of 9 mm, and a multi-filamentary wire having 61 filament was obtained, as shown in FIG. 1. Then, as shown in FIG. 2, the wire was further drawn until it has the diameter of 1.0 mm. Referring to FIG. 2, the multi-filamentary wire obtained in this manner consisted of 61 filaments 7 of superconducting material embedded in a matrix 6 of silver.

Figure 3:
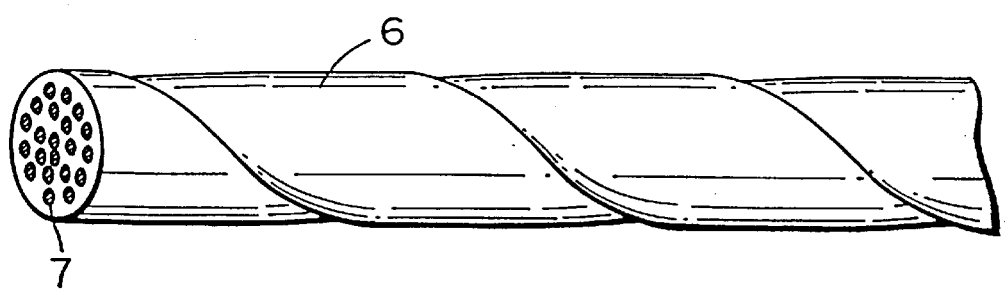

Then, referring to FIG. 3, the as-obtained multi-core wires after drawing, which had circular cross section, were twisted to have the twist pitch of 500 mm, 100 mm, 50 mm and 10 mm, respectively, and then lightly drawn to the diameter of 0.98 mmφ. The wires were rolled to have the tape width of 3.0mm and the thickness of 0.22 mm, and heat treatment was effected at 850° C. for 50 hours. Thereafter, the wires were further subjected to rolling until it had the thickness of 0.20 mm, and further heat treatment at 850° C. for 50 hours.

Figure 4:
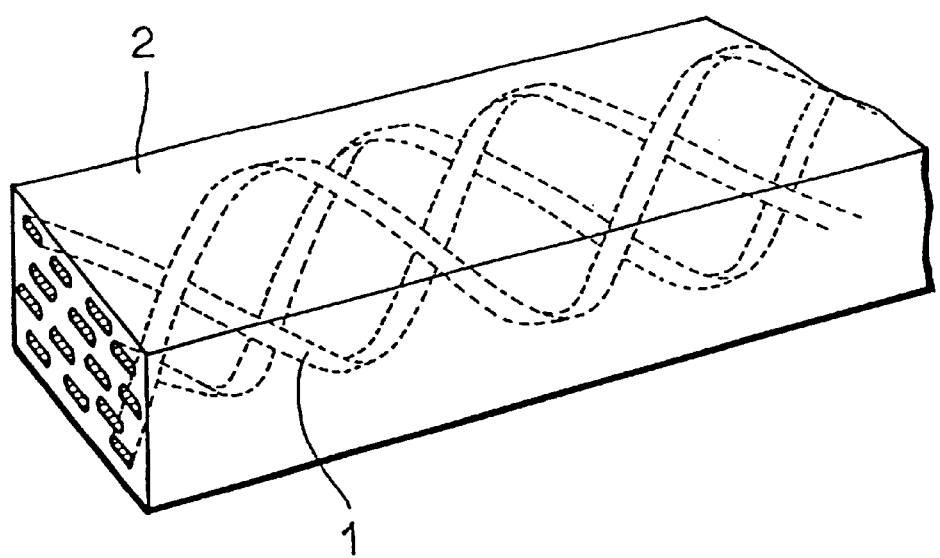
FIG. 4 is a perspective view showing the oxide superconducting wire of one example of the present invention.

FIG. 4 is a perspective view showing the oxide superconducting wire of one example of the present invention obtained in this manner.

Referring to FIG. 4, the oxide superconducting wire consists of 61 filaments of oxide superconductor in a matrix 2 of silver. The filament 1 is twisted spirally along the longitudinal direction of the wire.

Figure 5:
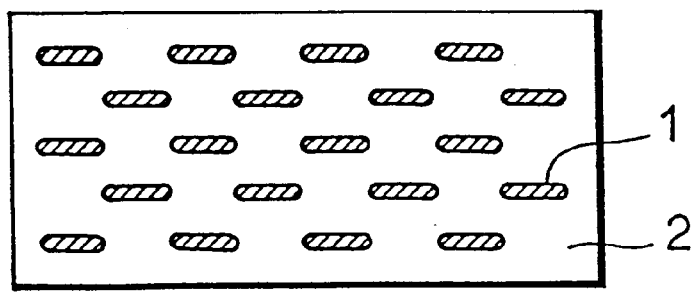
FIG. 5 is a cross section schematically showing the structure of the oxide superconducting wire shown in FIG. 4.

FIG. 5 is a cross section schematically showing the structure of the oxide superconducting wire shown in FIG. 4. Referring to FIG. 5, the oxide superconducting wire includes filaments 1 of oxide superconductor embedded in a matrix 2 of silver. Matrix 2 serves as a stabilizer.

In the similar manner, wires having different twist E-pitches were prepared, and respective wires were cut to have the length of 40 mm, critical current density Ic of respective cut wires were measured, and the influence of the twisting on the Ic was studied.

As a result, critical currents were 21 A, 20 A, 19 A and 17 A in the wires having the twist pitches of 500, 100, 50 and 10 mm, respectively. Though the critical current decreased slightly as the pitch was made smaller, it was not significantly reduced. The results were when a d.c. current was applied.

In this manner, four long oxide superconducting wires having the length of 13 m and different twist pitches were fabricated, and the obtained wires were wound in the shape of pancakes. The coil had the outer diameter of 100 mmφ, inner diameter of 40 mmφ and the height of 6 mm. Four coils were fabricated, using superconducting wires having mutually different twist pitches.

Figure 10:
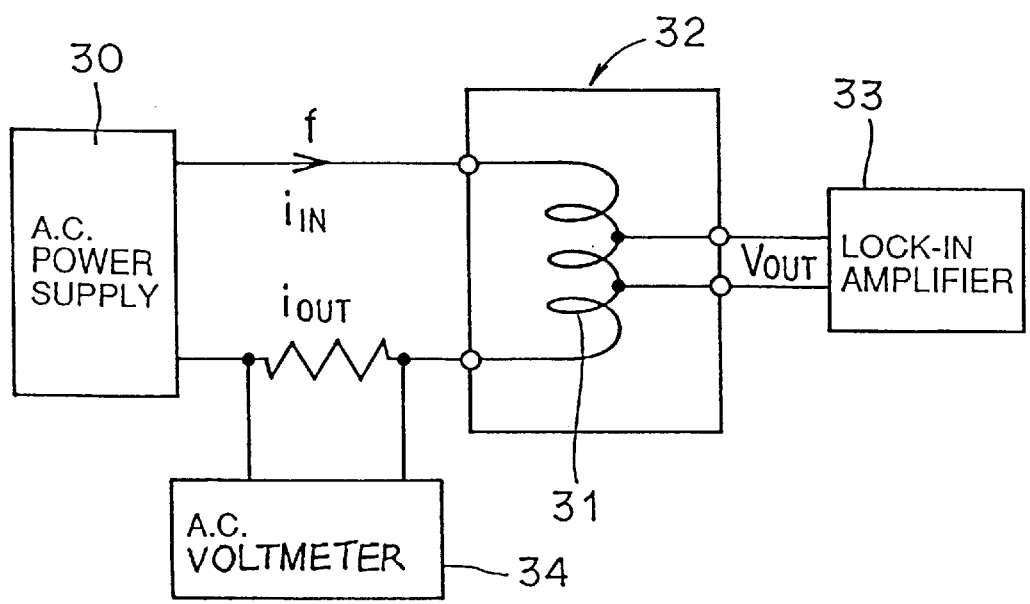
FIG. 10 shows a structure of an apparatus for measuring the a.c. loss of the oxide superconducting wire.

The a.c. loss in the coils obtained in this manner was measured and compared by using an apparatus such as shown in FIG. 10. The method of measurement will be discussed in detail.

Referring to FIG. 10, by using an a.c. power supply 30, an a.c. current was applied to a coil 31 in liquid nitrogen filled in a cryostat 32. The effective value $i_{IN}$ of the a.c. current was 5 A and a frequency f was 50 Hz. The coil voltage $v_{out}$ and the coil current $i_{out}$ generated at both ends of the coil 31 at this time were measured. In order to remove the voltage of inductance and to measure only the resistance component, the coil voltage $v_{out}$ was measured in accordance with the 0° phase output voltage of a lock-in amplifier 33. The coil current was measured by using an a.c. voltmeter 34.

By using the coil current value and the coil voltage value obtained in this manner, the a.c. loss was calculated in accordance with the following equation:

a.c. loss=(coil effective current value)×(coil voltage).

As a result of the measurement, the a.c. loss was 210 mW, 170 mW, 130 mW and 20 mW in the wires having the twist pitch of 500, 100, 50 and 10 mm, respectively.

As is apparent from the result, the a.c. loss decreases remarkably as the twist pitch is reduced.

Meanwhile, a long oxide superconducting wire having the length of 50 m was fabricated under the same condition as above except that it was not twisted after drawing. The obtained wire was wound in a double pancake in the similar manner and the a.c. loss was measured in the similar manner, which was 300 mW.

From the above, it can be understood that when a long wire is manufactured, if the wire is twisted after drawing in the steps of drawing and rolling, the a.c. loss of the coil employing the wire, can be significantly reduced.

The inventors tried to fabricate a wire having the length of 50 m and the twist pitch of smaller than 10 mm, for example 3 mm. However, during the step of twisting, the wire was disconnected at several portions, and such twisting was impossible.

Therefore, actually, it is necessary to make the twist pitch not smaller than the tape width.

EMBODIMENT 2

$Bi_2O_3$, PbO, $SrCO_3$, $CaCO_3$ and CuO were mixed to have the composition ratio of Bi:Pb:Sr:Ca:Cu= 1.81:0.40:1.98:2.21:3.03. The mixed powder was successively subjected to heat treatments in an ambient atmosphere at 750° C. for 12 hours, 800° C. for 8 hours and in a reduced pressure atmosphere of 1 Torr, at 760° C. for 8 hours. At the end of each heat treatment, the powder was pulverized. The powder obtained through such heat treatment and pulverization was further pulverized by a ball mill, and the powder of sub micron order was obtained. The powder was subjected to heat treatment at 800° C. for 2 hours, and then filled in a silver pipe having the outer diameter of 12 mm and the inner diameter of 11 mm.

Further, a pipe of silver with 10% of gold added having the outer diameter of 12.3 mmφ and the inner diameter of 12 mmφ was provided outside the silver pipe.

The powder filled in the double pipes was drawn to 1 mm, and the as-obtained wires were put together and inserted in a silver pipe having the outer diameter of 12 mm and the inner diameter of 9 mm, to provide a multi-filamentary wire having 61 filaments. This wire was further drawn to have the diameter of 1.0 mm.

The multi-filamentary wires after drawing which had circular cross section were twisted to have the twist pitch of 500 mm, 100 mm, 50 mm and 10 mm, respectively and lightly drawn to have the diameter of 0.98 mmφ. The as-obtained wires were rolled to have the thickness of 0.22 mm, and then subjected to heat treatment at 850° C. for 50 hours.

Figure 6:
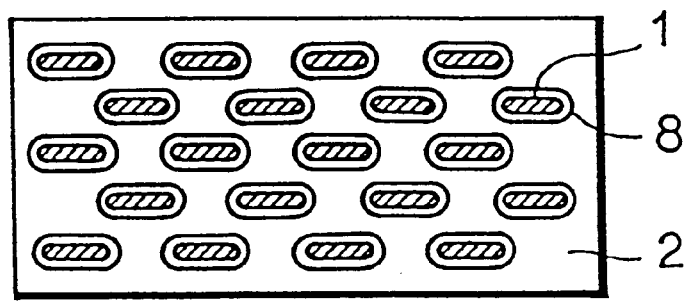
FIG. 6 is a cross section schematically showing the structure of the oxide superconducting wire of another example of the present invention.
Figure 7:
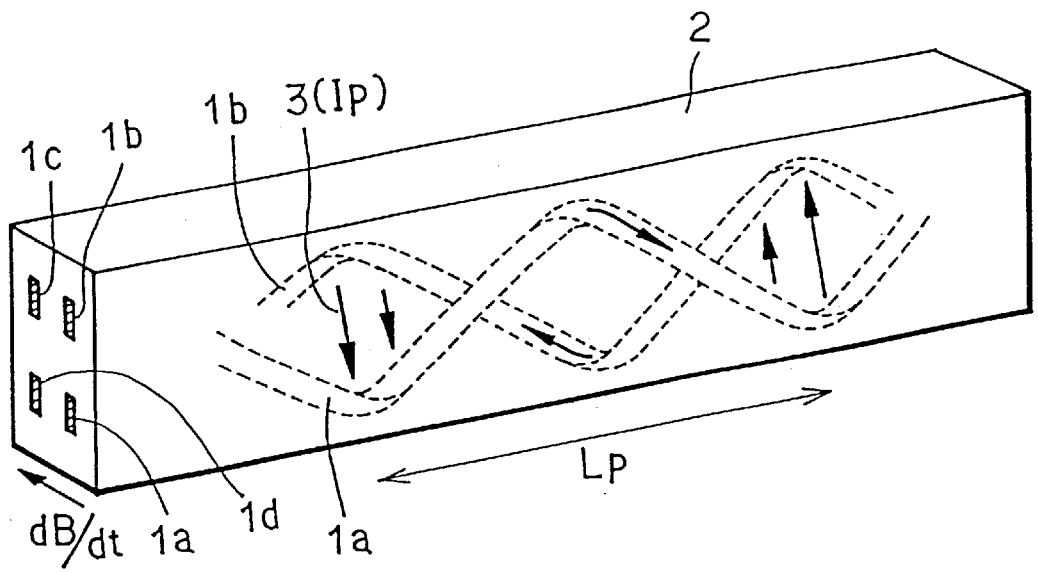
FIG. 7 is a perspective view showing an oxide superconducting multi-filamentary wire of an example of the present invention.
Figure 8:
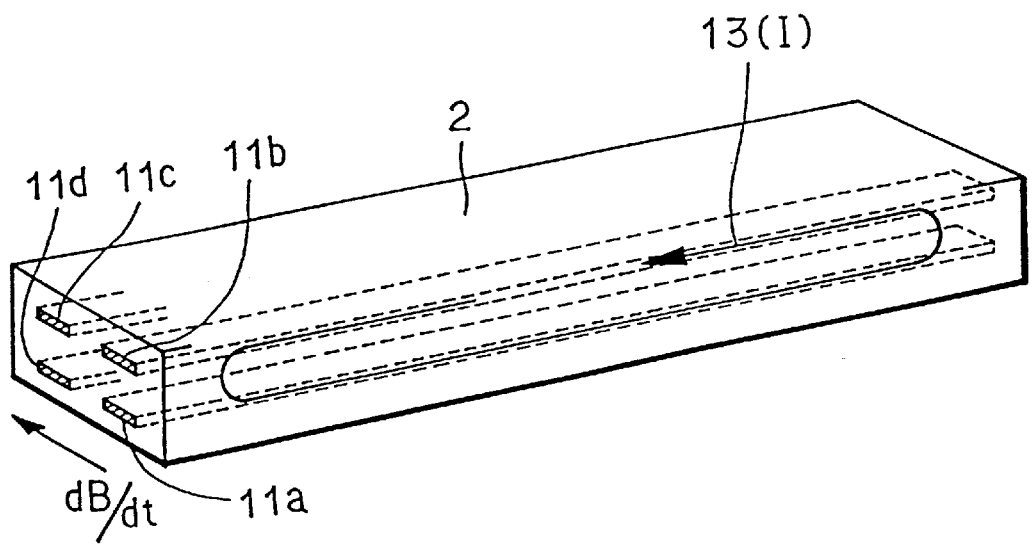
FIG. 8 is a perspective view showing a conventional oxide superconducting multi-filamentary wire.
Figure 9:
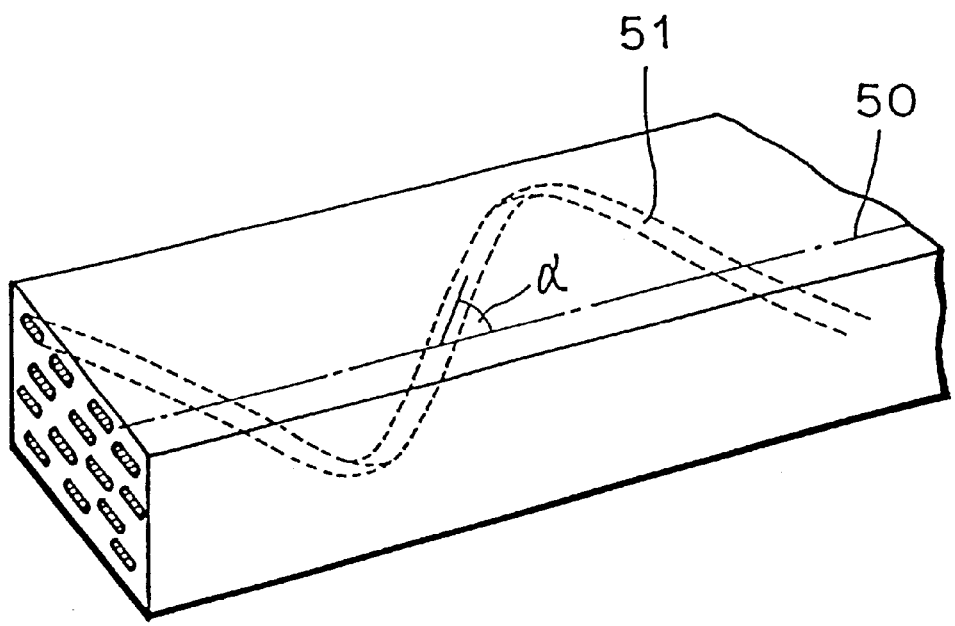
FIG. 9 illustrates the angle of inclination of the superconducting wire in accordance with the present invention.

FIG. 6 is a cross section showing the structure of the oxide superconducting wire in accordance with this another example of the present invention obtained in this manner.

Referring to FIG. 6, the oxide superconducting wire includes filaments 1 of oxide superconductor embedded in a matrix 2 of silver. Around the filament 1, a barrier layer 8 of silver with 10% gold added is provided, surrounding the filament 1.

In this manner, wires having different twist pitches were fabricated, and the wires were cut to have the length of 400 mm. Critical current Ic of each of the wires was measured, and the influence of twisting on the Ic was studied.

As a result, the critical currents were 21 A, 20 A, 19 A and 17 A in the wires having the twist pitches of 500, 100, 50 and 10 mm, respectively, and Ic was not significantly reduced, though slightly reduced as the pitch was made smaller. The results were when a d.c. current was applied.

Four oxide superconducting multi-filamentary wires having the length of 12 m and mutually different twist pitches were fabricated, and the obtained wires were wound in the shape of pancakes. Each coil has the outer diameter of 100 mmφ, the inner diameter of 40 mmφ and the height of 6 mm. Four coils were fabricated using superconducting wires having mutually different twist pitches.

The a.c. loss of the coils obtained in this manner was measured and compared by using the apparatus such as shown in FIG. 10, as in Example 1. More specifically, a.c. current having the effective value of 5 A and frequency of 50 Hz was applied to the coil in liquid nitrogen, only the resistance component of the voltage generated at both ends of the coil was detected in accordance with the 0° phase signal of the lock-in amplifier, and the a.c. loss was compared.

As a result, the a.c. loss was 74 mW, 40 mW, 27 mW and 3 mW in the wires having the twist pitches of 500, 100, 50 and 10 mm, respectively.

As is apparent from the result, the a.c. loss remarkably reduces as the twist pitch is made smaller.

Meanwhile, a long oxide superconducting wire having the length of 50 m was prepared under the same condition as above, except that it was not twisted after drawing and high resistance barrier was not provided. The obtained wire was wound in the shape of a double pancake in the similar manner, and the a.c. loss was measured, which was 300 mW.

From the above, it is understood that when a long wire is manufactured, in the steps of drawing and rolling, if the wire is drawn and then twisted, the a.c. loss of the coil employing the wire can be significantly reduced.

EXAMPLE 3

$Bi_2O_3$, PbO, $SrCO_3$, $CaCO_3$ and CuO were mixed to have the composition ratio of Bi:Pb:Sr:Ca:Cu= 1.81:0.40:1.98:2.21:3.03. The mixed powder was successively subjected to heat treatments in the ambient atmosphere at 750° C. for 12 hours, 800° C. for 8 hours and, in a reduced pressure atmosphere of 1 Torr, at 760° C. for 8 hours. At the end of each heat treatment, the powder was pulverized. The powder obtained through the heat treatment and pulverization was further pulverized by a ball mill, and the powder of the sub micron order was obtained. The powder was subjected to heat treatment at 800° C. for 2 hours, and then filled in a silver pipe having the outer diameter of 12 mm and the inner diameter of 9 mm.

The powder filled in the silver pipe was drawn to 1 mm, and the as-obtained wires were put together into a silver pipe having the outer diameter of 12 mm and the inner diameter of 9 mm, to provide a multi-filamentary wire having 61 filaments. The as-obtained wire was further drawn to have the diameter of 1.0 mm.

The multi-filamentary wires after drawing were twisted to have the twist pitches of 500 mm, 100 mm, 50 mm and 10 mm, respectively, and lightly drawn to have the diameter of 0.98 mmφ. The resulting wires were rolled to have the tape width of 3.0 mm and the thickness of 0.22 mm, and then subjected to heat treatment at 850° C. for 50 hours. Thereafter, the wires were further drawn to have the thickness of 0.20 mm, and subjected to heat treatment at 850° C. for 50 hours. Thereafter, the wires having different twist pitches were cut to have the length of 40 mm, critical current Ic thereof was measured, and the influence of the twisting on the Ic was studied.

As a result, the critical currents were 21 A, 20 A, 19 A and 17 A in the wires having the twist pitches of 500, 100, 50 and 10 mm, respectively, and Ic was not significantly reduced, though it was slightly lowered as the pitch was made smaller. The results were when a d.c. current was applied.

The twist angles of the wires having the twist pitches of 500, 300, 200 and 100 mm were studied, which were 0.3°, 0.5°, 0.9° and 1.7°, respectively. By using these tapes, property under strain of the Ic was studied at the bending diameter of 20 mm.

The influence of the twist pitch was studied in accordance with the ratio K ($K=Ic/Ic_0$) of the Ic ($Ic_0$) before bending and Ic after bending, the value K was 0.7, 0.85, 0.9 and 0.9 for the twist angle of 0.3°, 0.5°, 0.9° and 1.7°, respectively. It was recognized that the property under stain was improved as the twist angle increased. It was found that the effect was obtained when the angle was made at least 0.5°.

Four long oxide superconducting multi-filamentary wires having the length of 13 m and twist pitches of 500, 100, 50 and 10 mm, respectively were fabricated, and the resulting wires were wound in the shape of pancakes. Each coil has the outer diameter of 100 mmφ, the inner diameter of 40 mmφ and the height of 6 mm. Four coils were fabricated, using superconducting wires having mutually different twist pitches.

The a.c. loss of the coils obtained in this manner was measured and compared by using an apparatus such as shown in FIG. 10, as in Embodiment 1. More specifically, an a.c. current having the effective value of 5 A and the frequency of 50 Hz was applied to the coil in liquid nitrogen, and only the resistance component of the voltage generated at both ends of the coil was detected in accordance with the 0° phase signal of the lock-in amplifier, and the a.c. loss was compared.

As a result, the a.c. loss of the wires having twist pitches of 500, 100, 50 and 10 mm was 190 mW, 180 mW, 120 mW and 10 mW, respectively.

As can be understood from the result, the a.c. loss was reduced remarkably as the twist pitch was made smaller.

A long oxide superconducting wire having the length of 50 m was fabricated under the same conditions as above except that it was not twisted after drawing. The resulting wire was wound in a double pancake in the similar manner and the a.c. loss was measured in the similar manner, which was 300 mW.

It is understood from the foregoing that when a long wire is manufactured, in the steps of drawing and rolling, if the wire is twisted after drawing, it comes to have superior bending characteristics, less degradation of Ic and the a.c. loss of the coil can be significantly reduced, when the wire is wound into a coil.

EXAMPLE 4

$Bi_2O_3$, $PbO$, $SrCO_3$, $CaCO_3$ and $CuO$ were mixed to have the composition ratio of $Bi:Pb:Sr:Ca:Cu=$ 1.81:0.40:1.98:2.21:3.03. The mixed powder was successively subjected to heat treatments in the ambient atmosphere at 750° C. for 12 hours, 800° C. for 8 hours and in a reduced pressure atmosphere of 1 Torr, at 760° C. for 8 hours. At the end of each heat treatment, the powder was pulverized. The powder obtained through the heat treatment and pulverization was further pulverized by a ball mill, and the powder of sub micron order was obtained. The powder was heat treated at 800° C. for 2 hours, and filled in an alloy pipe of silver to which 10% gold was added, having the outer diameter of 12 mm and the inner diameter of 9 mm.

The powder filled in the silver alloy pipe was drawn to 1mm, and the as-obtained wires were put together and inserted into an alloy pipe of silver and 10% gold having the outer diameter of 12 mm and the inner diameter of 9 mm, to provide a multi-filamentary wire having 61 filaments. The wire was further drawn to the diameter of 1.0 mm.

The multi-filamentary wires after drawing, which had circular cross section were twisted to have the twist pitches of 500 mm, 100 mm, 50 mm and 10 mm, respectively, and lightly drawn to 0.98φ. The as-obtained wires were rolled to have the thickness of 0.22 mm and subjected to heat treatment at 850° C. for 50 hours. Thereafter, the wires were further rolled to have the thickness of 0.20 mm and subjected to heat treatment at 850° C. for 50 hours. Thereafter, wires having different twist pitches were cut to have the length of 400 mm, the critical current Ic of the wires was measured, and the influence of the twist on the Ic was studied.

As a result, the critical currents were 21 A, 20 A, 19 A and 17 A in the wires having twist pitches of 500, 100, 50 and 10 mm, and Ic was not significantly reduced, though it was slightly decreased as the pitch was made smaller. The results were when a d.c. current was applied.

In this manner, four long oxide superconducting multi-filamentary wires having the length of 13 m and mutually different twist pitches were fabricated, and the resulting wires were wound in the shape of pancakes. Each coil has the outer diameter of 100 mmφ, the inner diameter of 40 mmφ and the height of 6 mm. Four coils were fabricated using superconducting wires of mutually different twist pitches.

The a.c. loss of the coils obtained in this manner was measured and compared by using an apparatus such as shown in FIG. 10, as in Example 1. More specifically, an a.c. current having the effective value of 5 A and frequency of 5 Hz was applied in liquid nitrogen, and only the resistance component of the voltage generated at both ends of the coil was detected in accordance with the 0° phase signal of the lock-in amplifier, and the a.c. loss was compared.

As a result, the a.c. loss was 80 mW, 35 mW, 33 mW and 5 mW in the wires having the twist pitches of 500, 100, 50 and 10 mm, respectively.

As is apparent from the results, the a.c. loss was significantly reduced as the twist pitch was reduced.

A long oxide superconducting wire having the length of 50 m was fabricated under the same conditions as above except that it was not twisted after drawing. The obtained wire was wound similarly in a double pancake, and the a.c. loss was measured, which was 300 mW.

It is understood from the foregoing that when a long wire is manufactured, in the steps of drawing and rolling, if the wire is twisted after drawing, the a.c. loss of the coil can be significantly reduced when the wire is wound into a coil.

EXAMPLE 5

By using the tape-like superconducting wire covered by a metal sheath in accordance with the present invention, a small coil having the specification shown in Table 1 below was fabricated and the a.c conduction characteristics was studied in accordance with the conduction conditions specified in Table 2. Silver or silver with 10% Au added thereto was used as the metal sheath. The twist pitch was 20 mm and 50 mm, and a wire which was not twisted was also fabricated for comparison.

TABLE 1

| Coil Specification | | |
|---|---|---|
| coil | inner diameter | 20 mmφ |
|  | outer diameter | 40 mmφ |
|  | height | 12 mm |
|  | double pancake | 2 |
| tape wire | sheath metal | Ag or Ag + 10% Au |
|  | width | 2.7 mm |
|  | thickness | 0.72 mm |
|  | length | 3m/double pancake |

TABLE 2

| Conduction Condition | |
|---|---|
| frequency | 30Hz |
| applied current | .10A |
| peak magnetic field | ±321 gauss |
| temperature of measurement | 77K (in liquid nitrogen) |

The result of measurement of the a.c. loss measured by using the apparatus shown in FIG. 10 as in Example 1 is as shown in Table 3 below.

TABLE 3

| | a.c. loss | |
|---|---|---|
| twist pitch | when Ag was used for metal sheath | when Ag+10% Au was used for metal sheath |
| 20 mm | 100 mW | 10 mW |
| 50 mm | 150 mW | 20 mW |
| not twisted | 200 mW | 70 mW |

By collecting a plurality of oxide superconducting wires fabricated in the manner as described above, an oxide superconducting cable conductor can be obtained.

The present invention can be applied not only to the manufacture of a bismuth superconducting wire but also to manufacture of thallium and yttrium superconducting wires.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an oxide superconducting wire including the steps of:

heat treating and covering with a primary metal sheath of silver or silver alloy, a powder mainly consisting of an oxide superconducting material;

drawing to provide a single filamentary wire; and putting together as-obtained single filamentary wires in a secondary metal sheath of silver or silver alloy to provide a multi-filamentary wire, drawing and rolling, and further heat treating, wherein in the steps of drawing and rolling after the multi-filamentary wire is prepared, the as-obtained wire having a circular cross section is drawn, twisted and drawn again before rolling to a thickness of about 0.2 mm.

2. The method of manufacturing an oxide superconducting wire according to claim 1, wherein twist pitch after rolling is made to be at least the width of the wire after rolling.

3. The method of manufacturing an oxide superconducting wire according to claim 1, wherein angle of inclination of the twist after rolling is made at least 0.5° with respect to a direction of said wire.

* * * * *

UNITED STATES PATENT AND TRADEMARK OFFICE
CERTIFICATE OF CORRECTION

PATENT NO. : 6,272,732 B1
DATED : August 14, 2001
INVENTOR(S) : Kengo Ohkura and Kenichi Sato It is certified that error appears in the above-identified patent and that said Letters Patent is hereby corrected as shown below:

<u>Title page,</u>
Item [73], Assignee, add -- Japan Science and Technology Corporation, Japan. --

Signed and Sealed this

Tenth Day of September, 2002

Attest:

Attesting Officer

JAMES E. ROGAN
*Director of the United States Patent and Trademark Office*